United States Patent [19]
Wei

[11] Patent Number: 6,027,979
[45] Date of Patent: *Feb. 22, 2000

[54] METHOD OF FORMING AN INTEGRATED CIRCUIT DEVICE

[75] Inventor: Che-Chia Wei, Plano, Tex.

[73] Assignee: STMicroelectronics, Inc., Carrollton, Tex.

[*] Notice: This patent is subject to a terminal disclaimer.

[21] Appl. No.: 09/073,417

[22] Filed: May 6, 1998

Related U.S. Application Data

[63] Continuation of application No. 08/726,335, Oct. 3, 1996, Pat. No. 5,837,587, which is a continuation of application No. 08/426,874, Apr. 24, 1995, abandoned, which is a division of application No. 07/769,185, Sep. 30, 1991, Pat. No. 5,894,158.

[51] Int. Cl.⁷ .................................................. H01L 21/336
[52] U.S. Cl. .............................. 438/305; 438/306
[58] Field of Search ..................... 438/305, 306, 438/307, 299, 301, 303, 290, 291, FOR 188

[56] References Cited

U.S. PATENT DOCUMENTS

| | | | |
|---|---|---|---|
| 4,342,149 | 8/1982 | Jacobs et al. | 29/576 |
| 4,597,824 | 7/1986 | Shinada et al. | 156/643 |
| 4,642,878 | 2/1987 | Maeda | 29/571 |
| 4,649,629 | 3/1987 | Miller et al. | 438/305 |
| 4,771,014 | 9/1988 | Liou et al. | 437/41 |
| 4,843,023 | 6/1989 | Chiu et al. | 437/34 |
| 4,855,246 | 8/1989 | Codella et al. | 437/41 |
| 4,894,694 | 1/1990 | Cham et al. | 357/188 |
| 4,950,617 | 8/1990 | Kumagai et al. | 437/41 |
| 4,968,639 | 11/1990 | Bergonzoni | 437/57 |
| 5,227,321 | 7/1993 | Lee et al. | 437/44 |
| 5,504,023 | 4/1996 | Hong | 438/305 |
| 5,534,447 | 7/1996 | Hong | 257/344 |

FOREIGN PATENT DOCUMENTS

| | | | |
|---|---|---|---|
| 60-64472 | 4/1985 | Japan | 438/188 |
| 60-263468 | 12/1985 | Japan | 438/188 |
| 62-163374 | 12/1985 | Japan . | |
| 63-302565 | 12/1988 | Japan . | |

OTHER PUBLICATIONS

Ogura et al. "A Half Micron Mosfet using Double Implanted LDD," pager 29.6 from the 1982 IEDM Digest 1, pp. 718–21.

"Triple Diffusion Doubles RAM Speed," Lineback, Robert J., *Electronics* May 5, 1983, pp. 54,61.

*Primary Examiner*—Michael Trinh
*Attorney, Agent, or Firm*—Theodore E. Galanthay; Lisa K. Jorgenson; Christopher F. Regan

[57] ABSTRACT

A mask is used for lightly doped drain and halo implants in an integrated circuit device. The mask exposes only portions of the substrate adjacent to field effect transistor gate electrodes. Since the halo implant is made only near the transistor channels, where it performs a useful function, adequate device reliability and performance is obtained. Since the halo implant is masked from those portions of the active regions for which it is not necessary, active region junction capacitances are lowered. Such lowered capacitances result in an improved transistor switching speed. The mask used to define the lightly doped drain and halo implant region can be easily formed from a straight forward combination of already existing gate and active area geometries.

6 Claims, 2 Drawing Sheets

METHOD OF FORMING AN INTEGRATED CIRCUIT DEVICE

This application is a continuation of Ser. No. 08/726,335 filed Oct. 3, 1996, U.S. Pat. No. 5,837,587, which is a Continuation of U.S. Ser. No. 08/426,874 filed Apr. 24, 1995, abandoned, which is a Division of U.S. Ser. No. 07/769,185 filed Sep. 30, 1991, U.S. Pat. No. 5,894,158.

BACKGROUND OF THE INVENTION

1. Field of the Invention

The present invention relates generally to the fabrication of integrated circuit devices, and more particularly to a technique for reducing junction capacitances in field effect transistors.

2. Description of the Prior Art

Integrated circuit device geometries well below one micron feature sizes continue to become increasingly common. In general, the use of smaller devices on integrated circuit chips results in better performance and high packing density, thereby reducing cost while increasing performance. However, with such small feature sizes device performance is significantly adversely impacted by physical effects which can be largely ignored with larger devices. Therefore, transistor reliability becomes an important issue in the sub-micron regime.

One problem which is important for small geometry devices is known as the hot electron effect. This effect refers generally to the injection of energetic electrons from the channel region into the gate, causing degradation at transistor parameters such as threshold voltage and transconductants, therefore resulting in worse performance. The effect is more pronounced for n-channel devices. Numerous transistor designs have been proposed and investigated in order to solve the hot electron injection problem.

One approach to dealing with the hot electron effect utilizes lightly doped drains (LDD) and a halo implant. Halo implants are moderately doped implants of the same conductivity type as the well or substrate in which the transistor is formed, and which lie in a thin layer generally along the source/drain to substrate/well junctions. A combination of LDD structures and halo implants has proven to achieve good device performance and reliability. However, due to the extra impurities used to form the halo in the junction areas, higher junction capacitances are obtained. This is true for both n-channel and p-channel devices. These increased junction capacitances tend to adversely impact transistor switching speeds.

It would be desirable to provide a method for fabricating integrated circuit transistors which provides good protection from hot electron effects. It is further desirable for such a method to minimize source/drain capacitances to improve operating speeds for the device.

SUMMARY OF THE INVENTION

Therefore, according to the present invention, a mask is used for lightly doped drain and halo implants in an integrated circuit device. The mask exposes only portions of the substrate adjacent to field effect transistor gate electrodes. Since the halo implant is made only near the transistor channels, where it performs a useful function, adequate device reliability and performance is obtained. Since the halo implant is masked from those portions of the active regions for which it is not necessary, active region junction capacitances are lowered. Such lowered capacitances result in an improved transistor switching speed. The mask used to define the lightly doped drain and halo implant region can be easily formed from a straight forward combination of already existing gate and active area geometries.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
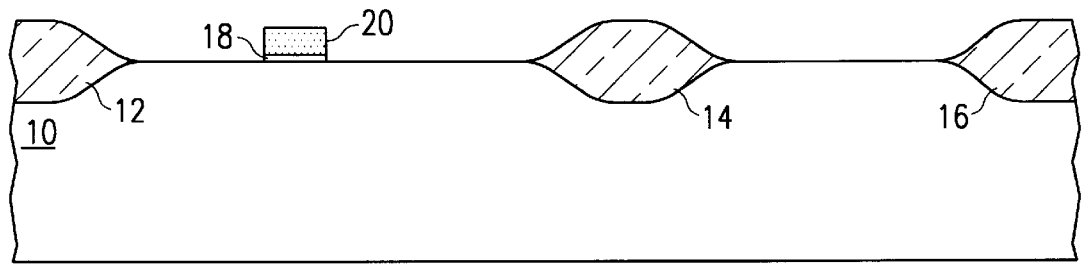
FIGS. 1–3 illustrate a preferred method for forming integrated circuit transistors according to the present invention.

Referring to FIG. 1, an integrated circuit device will be formed on a substrate 10. Field oxide regions 12, 14, 16 are defined and grown as known in the art. A field effect transistor gate electrode, consisting of a gate oxide layer 18 and a polycrystalline silicon layer 20, is formed as known in the art. The polycrystalline silicon layer 20 may be silicided with a refractory metal to increase conductivity.

To this point, the processing steps have been conventional. At this stage of the fabrication process, the device is ready for a lightly doped drain (LDD) and halo implant.

Figure 2:
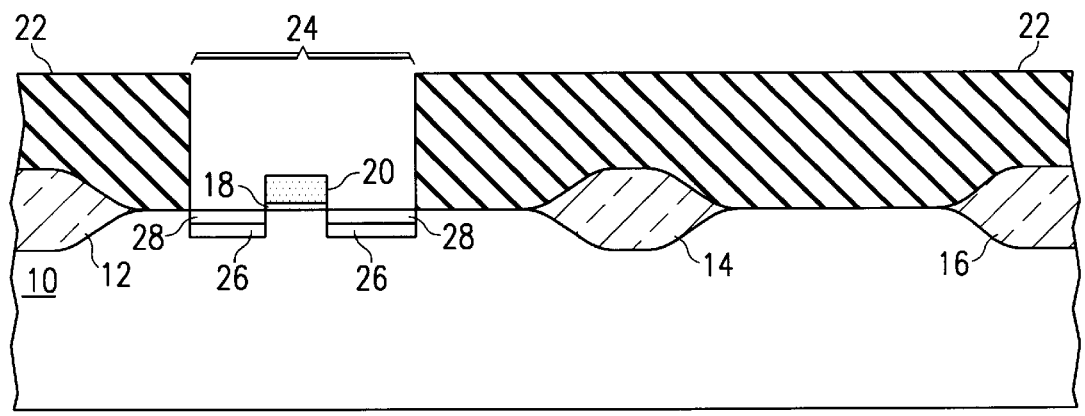

Referring to FIG. 2, a layer of photoresist 22 is applied to the device and patterned to define an opening 24. The opening 24 exposes the gate electrode and adjacent regions of the substrate 10. Other regions of the substrate are covered, and thus protected from implantation of impurities.

Impurities used to define a halo region 26 and LDD region 28 are implanted into the substrate 10 through the opening 24. For an n-channel transistor, regions 28 are doped $n^-$, and halo regions 26 are doped p-type. For a p-channel transistor, the LDD regions 28 are doped $p^-$ and the halo regions 26 are doped n-type.

Figure 3:
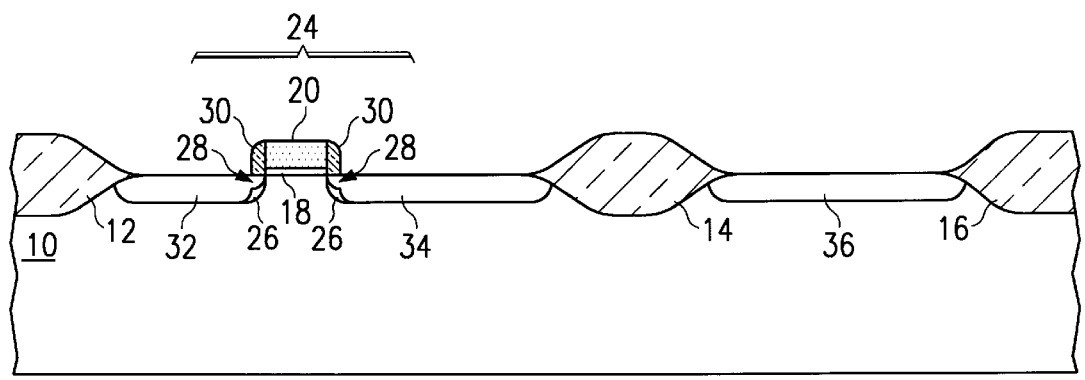

Referring to FIG. 3, the resist layer 22 is removed and sidewall spacers 30 formed as known in the art using an oxide layer deposition and anisotropic etchback. After formation of the sidewall spacers 30, heavily doped source/drain regions 32, 34, 36 are implanted. Diffusion of the source/drain regions, LDD regions, and halo regions is caused by a thermal annealing step to activate the implants. This results in a structure approximately as shown in FIG. 3, with the halo regions 26 helping to minimize the hot electron effect as is known in the art.

Because most of the active regions were masked by the resist layer 22 while the halo regions 26 were implanted, the increased junction capacitance caused by implantation of the halo regions 26 occurs only within the region 24 near the gate electrode. The remainder of active regions 32 and 34, and the entirety of region 36, are not subjected to the halo implant. In these regions, the source/drain junction capacitance has a relatively low value.

In the preferred method, the LDD implants are made with the photoresist layer 22 in place. Although the LDD implant also does not extend into active regions not adjacent the gate electrode, this has little effect since the LDD regions 28 are effective only at the ends of the channel region underneath the gate oxide 18.

Figure 4:
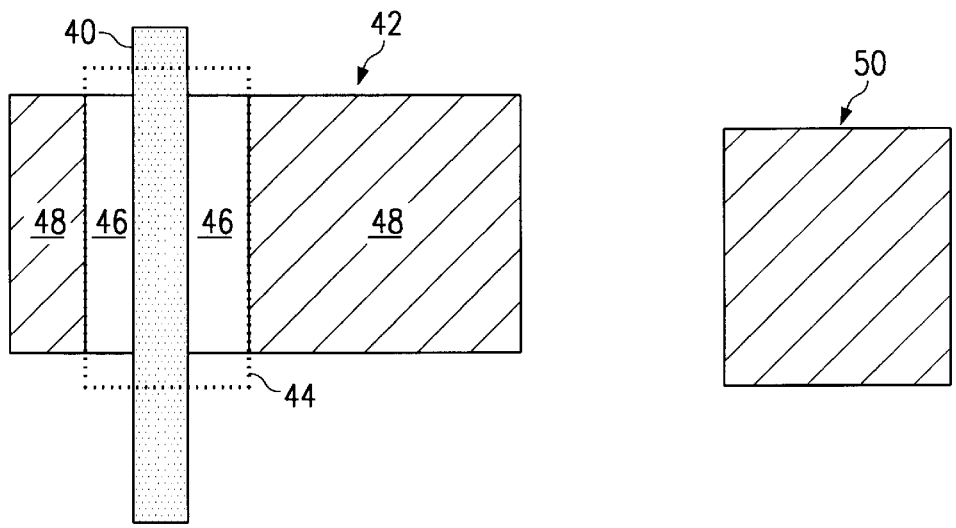
FIGS. 4 and 5 illustrate partial semiconductor integrated circuit layouts illustrating use of the preferred technique.

FIG. 4 is a top view of a portion of a hypothetical integrated circuit device illustrating a preferred masking layout for resist layer 22. In FIG. 4, gate electrode 40 overlies rectangular active region 42. A rectangular photoresist mask opening is defined by dotted line 44. The halo and LDD implants are made only into regions 46 within the active region 42. The remaining portions 48 of active region 42 do not receive the halo implant. In addition, active region 50, which does not contain a gate electrode, receives no halo implant at all.

The area in which the increased junction capacitance occurs is the region 46 adjacent to the gate electrode 40. Since only a relatively small portion of the total active area has such a halo implant, the total increase in junction capacitance for the device, above that which would exist without any halo implants at all, is relatively modest.

Figure 5:
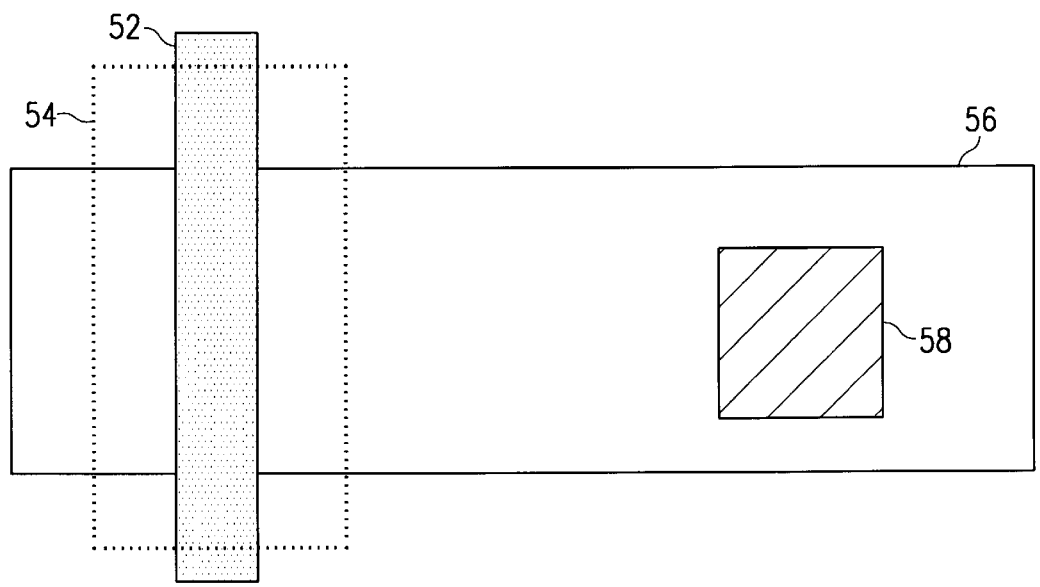

FIG. 5 shows another layout, with a gate electrode 52 and mask opening 54 as shown. Active region 56 is one source/drain region for the transistor defined by gate electrode 52, and is used to make a contact with an interconnect contact location 58. Again, it will be seen that the halo implant is confined to the regions near the gate electrode, so that the overall increase in junction capacitance is relatively low.

The mask used to pattern the photoresist to define the openings 44 and 54 can be created by generating a mask which is the intersection of the poly gate and the active region geometries. The openings thus formed are then enlarged somewhat in order to accommodate possible misalignment and to ensure that the halo and LDD implants will extend for some distance laterally of the channel region. The n-channel halo implant mask can only be performed in the p-well region, and the p-channel halo implant mask can only be performed in the n-well region. Combining already defined and tested patterns in this way helps to minimize pattern generation complexity.

It will be appreciated by those skilled in the art that the described technique can lead to a significant decrease in junction capacitance for integrated circuit devices. The extent of the capacitance decrease is dependent in large part upon the ratio of the area which receives the halo implant to that which does not. The halo implant is eliminated entirely in regions which do not have gate electrodes, such as active interconnections and contact regions used for well strapping.

If desired, the mask used to pattern the resist layer 22 for the LDD and halo implant can also be used for the threshold voltage ($V_T$) implants. Eliminating the ($V_T$) implants can provide a further reduction in junction capacitance because the implant tends to increase the surface carrier concentration, especially in n-channel devices. Reuse of the same mask for this purpose provides improved transistor performance, and minimal additional cost and complexity to the fabrication process.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a portion of an integrated circuit device, comprising the steps of:

forming a gate electrode on a semiconductor substrate with a gate insulating layer therebetween;

then prior to performing a lightly doped drain implant, forming a masking layer over the substrate, the masking layer having an opening where the gate electrode crosses an active area of the substrate to define a field effect transistor, the opening of the masking layer exposing only portions of the active area adjacent the gate electrode and not the remaining portions of the active area;

performing a lightly doped drain implant of impurities having a second conductivity type and a halo implant of impurities having a first conductivity type into the substrate through the opening in the masking layer so that the remaining portions of the active area do not receive either the halo implant or the light doped drain implant; and after the halo implant performing step, removing the first masking layer, forming sidewall spacers alongside the gate electrode, and forming heavily doped source and drain regions in the substrate in the exposed and remaining portions of the active area adjacent the gate electrode.

2. A method as defined in claim 1, wherein the active area crossed by the gate electrode has the first conductivity type, wherein the masking layer comprises a first masking layer, and wherein the method further comprises:

forming a second gate electrode over a second active area of the substrate, the second active area having the first conductivity type;

forming a second masking layer over the device, the second masking layer having an opening whereby the second gate electrode crosses the second active area of the substrate to define a second field effect transistor; and performing a halo implant of impurities having the second conductivity type into the substrate through the opening in the second masking layer.

3. A method as defined in claim 2, further comprising the step of performing a lightly doped drain implant of impurities having the first conductivity type through the opening in the second masking layer.

4. A method for fabricating a portion of an integrated circuit device, comprising the steps of:

performing a voltage adjust implant on at least a portion of an active area of a semiconductor substrate;

forming a gate electrode on a semiconductor substrate with a gate insulating layer therebetween;

then prior to performing a lightly doped drain implant, forming a masking layer over the substrate, the masking layer having an opening where the gate electrode crosses the active area of the substrate to define a field effect transistor, the opening of the masking layer exposing only portions of the active area adjacent the gate electrode and not the remaining portions of the active area;

performing a lightly doped drain implant of impurities having a second conductivity type and a halo implant of impurities having a first conductivity type into the substrate through the opening in the masking layer so that the remaining portions of the active area do not receive either the halo or the light doped drain implant; and after the halo implant performing step, removing the masking layer, forming sidewall spacers alongside the gate electrode, and forming heavily doped source and drain regions in the substrate in the exposed and remaining portions of the active area adjacent the gate electrode.

5. A method as defined in claim 4, wherein the active area crossed by the gate electrode has the first conductivity type, wherein the masking layer comprises a first masking layer, and wherein the method further comprises:

forming a second gate electrode over a second active area of the substrate, the second active area having the first conductivity type;

forming a second masking layer over the device, the second masking layer having an opening whereby the second gate electrode crosses the second active area of the substrate to define a second field effect transistor; and performing a halo implant of impurities having the second conductivity type into the substrate through the opening in the second masking layer.

6. A method as defined in claim 5, further comprising the step of performing a lightly doped drain implant of impurities having the first conductivity type through the opening in the second masking layer.

* * * * *